US012782482B2

United States Patent

(12) United States Patent
Tyburn et al.

(10) Patent No.: US 12,782,482 B2
(45) Date of Patent: Nov. 3, 2026

(54) FAST SWITCH FIELD COMBINED NMR DEVICE FOR 2FNMR

(71) Applicant: Bruker France S.A.S., Wissembourg (FR)

(72) Inventors: Jean-Max Tyburn, Wissembourg (FR); Sébastien Bréham, Wissembourg (FR); Eric Beyer, Eberbach-Seltz (FR)

(*) Notice: Subject to any disclaimer, the term of this patent is extended or adjusted under 35 U.S.C. 154(b) by 149 days.

(21) Appl. No.: 18/894,276

(22) Filed: Sep. 24, 2024

(65) Prior Publication Data

US 2025/0102604 A1 Mar. 27, 2025

(30) Foreign Application Priority Data

Sep. 26, 2023 (EP) .................................... 23315367

(51) Int. Cl.

*G01R 33/44* (2006.01)
*G01R 33/3815* (2006.01)
*G01R 33/383* (2006.01)

(52) U.S. Cl.

CPC ....... *G01R 33/448* (2013.01); *G01R 33/3815* (2013.01); *G01R 33/383* (2013.01)

(58) Field of Classification Search

CPC .............. G01R 33/448; G01R 33/3815; G01R 33/383; G01R 33/421; G01R 33/3873; G01R 33/445; G01R 33/307

USPC ......................................................... 324/307

See application file for complete search history.

(56) References Cited

U.S. PATENT DOCUMENTS

| | | | | | |
|---|---|---|---|---|---|
| 5,552,709 | A * | 9/1996 | Anderson | G01R 33/30 | 324/318 |
| 5,708,362 | A * | 1/1998 | Frese | G01R 33/3806 | 324/319 |
| 8,384,387 | B1 * | 2/2013 | Damadian | A61B 5/704 | 324/319 |

(Continued)

FOREIGN PATENT DOCUMENTS

| | | | |
|---|---|---|---|
| EP | 3081954 | A1 | 10/2016 |
| EP | 4071492 | A1 | 10/2022 |
| WO | 2011151049 | A1 | 12/2011 |

OTHER PUBLICATIONS

Written Opinion of the International Searching Authority. (Year: 2024).*

(Continued)

*Primary Examiner* — Christopher P McAndrew
(74) *Attorney, Agent, or Firm* — DECODE Legal Inc.

(57) ABSTRACT

A Two-Field-NMR spectrometer for performing field-cycling NMR relaxometry experiments comprises a high field superconducting NMR magnet system for generating a homogenous magnetic field parallel to a z-axis in a central region of the spectrometer for polarization of an NMR sample and for detection of NMR signals; a low field magnet system generating a variable homogenous magnetic field; a magnetic tunnel connecting the center of the high field magnet system with the low field magnet system; and a shuttle system designed for shuttling the NMR sample between the high field and the low field magnet system, wherein the magnetic tunnel is provided with a further magnet system, and wherein the high field magnet system, the magnetic tunnel and the low field magnet system are arranged coaxially about the z-axis along a bore of the high field magnet system.

15 Claims, 5 Drawing Sheets

A) B) C) D) E) F) G) H)

(56) References Cited

U.S. PATENT DOCUMENTS

| | | | | |
|---|---|---|---|---|
| 11,187,766 | B1 * | 11/2021 | Zhang | G01R 33/34092 |
| 11,579,224 | B2 * | 2/2023 | Guenter | G01R 33/307 |
| 2002/0196022 | A1 * | 12/2002 | Tschirky | G01R 33/307<br>324/318 |
| 2005/0245810 | A1 * | 11/2005 | Khamene | G01R 33/56<br>600/410 |
| 2006/0091881 | A1 * | 5/2006 | Clarke | G01R 33/326<br>324/301 |
| 2008/0204019 | A1 * | 8/2008 | Xue | G01R 33/341<br>324/309 |
| 2009/0015259 | A1 * | 1/2009 | Courtney | G01R 33/30<br>324/318 |
| 2011/0316536 | A1 * | 12/2011 | Price | G01R 33/302<br>324/309 |
| 2016/0076924 | A1 | 3/2016 | Pusiol et al. | |
| 2021/0318402 | A1 * | 10/2021 | De Oliveira | G01R 33/4633 |
| 2022/0163610 | A1 * | 5/2022 | Guenter | G01R 33/3873 |
| 2023/0070852 | A1 * | 3/2023 | Meister | G01N 15/1404 |

OTHER PUBLICATIONS

R. Kimmich et al., "Field-cycling NMR relaxometry", Progress in Nuclear Magnetic Resonance Spectroscopy 44 (2004) 257-320.

I. V. Zhoukov et al., "Field-cycling NMR experiments in an ultra-wide magnetic field range: relaxation and coherent polarization transfer", Phys. Chem. Chem. Phys., 2018, 20, 12396-12405.

Alexey S. Kiryutin et al, "A fast field-cycling device for high-resolution NMR: Design and application to spin relaxation and hyperpolarization experiments", Journal of Magnetic Resonance, vol. 263, Dec 29, 2015, pp. 79-91.

Jonas Milani et al: "A magnetic tunnel to shelter hyperpolarized fluids", Review of Scientific Nstruments, vol. 86, No. 2, Feb. 2015, pp. 1-8.

Samuel F. Cousin et al: "Recovering Invisible Signals by Two-Field NMR Spectroscopy", Angewandte Chemie (International ed.), Aug. 16, 2016 (Aug. 16, 2016), pp. 9886-9889.

* cited by examiner

FAST SWITCH FIELD COMBINED NMR DEVICE FOR 2FNMR

BACKGROUND OF THE INVENTION

Field of the Invention

The invention relates to a Two-Field Nuclear Magnetic Resonance spectrometer adapted for performing field-cycling techniques NMR relaxometry experiments comprising: a high field superconducting NMR magnet system for generating a homogenous magnetic field parallel to a z-axis in a central region of the two-field-NMR spectrometer for polarization of an NMR sample and for detection of NMR signals; a low field magnet system generating a variable homogenous magnetic field; a magnetic tunnel connecting the center of the high field superconducting NMR magnet system with the low field magnet system; and a shuttle system designed for shuttling the NMR sample between the high field superconducting NMR magnet system and the low field permanent magnet system. A field-cycling NMR spectrometer comprising high field superconducting NMR magnet, a low field magnet system and a shuttle system is known from EP 4 071 492 B1.

Description of the Related Art

In general, the present invention relates to the technical field of magnetic resonance. Nuclear magnetic resonance ("NMR") spectroscopy is a powerful tool in instrumental chemical analysis and a commercially widespread method for analyzing and characterizing the chemical composition of substances. In NMR experiments, a sample is exposed to a strong static magnetic field, which interacts with spins of nuclei contained in the sample. Radio frequency ("RF") pulses are sent into the sample for manipulating the spins, and the sample's reaction, i.e., RF signals (also called "NMR signals") are measured. The sample's reaction depends on the environment of the nuclei in the sample, in particular bonding electrons. Accordingly, information about the chemical structure of the sample can be obtained by analysing the NMR signals measured.

Improvements of NMR methods like field-cycling allow exploiting interaction of nuclear spins with magnetic fields of different strengths, by means of which more spectroscopic information about the sample becomes accessible. Field-cycling techniques in NMR have been applied on various field dependent studies. The main idea is to measure the relaxation in the frequency basis. Its applications include material science, such as polymer dynamics, and structural biology, such as membrane dynamics and protein dynamics, and relaxation measurements on contrast agent in MRI field, etc.

In particular, in two-field NMR ("2F-NMR") experiments, nuclear spins may be exposed to and manipulated by means of RF pulses at two different magnetic field strengths. This allows obtaining additional spectroscopic information about the sample, in particular dynamic information or an additional measurement dimension, which may be used to increase resolution, in particular to identify maxima in spectra more reliably.

At a first working volume equipped with the first NMR probe, a first field strength ("high field") with a high homogeneity is present, allowing in particular a strong initial polarization and a signal detection with high resolution and high sensitivity. Further, nuclear spin manipulations may be done at the first working volume. At a second working volume equipped with the second NMR probe, a second field strength ("low field") with an at least fairly good homogeneity is present, which also allows nuclear spin manipulations, in particular band-selective manipulations of spins.

For numerous nuclear spin systems, the coupling properties and/or the relaxation times depend on the magnetic field strength present. Accordingly, since there are two different field strengths available, a 2F-NMR apparatus may perform experiments, which make use of the different coupling properties and/or relaxation times in the same single measurement.

This provides additional information about the sample in spectroscopy applications. In particular, dynamic information (movement information) about nuclei in the sample or molecules containing said nuclei may be obtained. Thus, an additional dimension of NMR measurement of the sample becomes available. This additional dimension is based on a different second field strength and therefore on a different physical behavior, as compared to the physical behavior at the first field strength. In other words, the development of a spin system in the sample is different at the first and second field strength.

The temporal exposure of the sample to a variable relaxation field can be performed either by electronically switching the current in a magnet coil or by moving the sample mechanically between positions of different magnetic flux densities. The latter field-cycling variant is also referred to as 'sample shuttle technique' being used in the present invention. Good electronically switched relaxometers have a field switching and settling time to the required accuracy and stability in the order of a millisecond, whereas sample shuttling times can be achieved in less than 100 ms (see e.g. EP 4 071 492 B1).

Rainer Kimmich and Esteban Anoardo, "Field-cycling NMR relaxometry", Progress in Nuclear Magnetic Resonance Spectroscopy 44 (2004) 257-320 give a general overview of the FFC NMR principles.

In a typical 2-field NMR experiment, the sample is first exposed to a first, strong magnetic field at a first location (first magnetic center, first sample volume) and then moved to a second location (second magnetic center, second sample volume) of a second, weaker magnetic field in which nuclear spins are relaxed and/or manipulated, and finally the sample is brought back to the location of the first, strong magnetic field where the actual NMR measurement takes place.

At the first location, the sample is polarized in a magnetic field with a flux density as high as technically feasible. The relaxation process takes place in a low-field interval varied with respect to length and lower flux density. The signal remaining after this relaxation interval is detected in a further field of fixed flux density again as high as possible.

At the second location, the polarization can be transferred to a desired atomic nucleus, as a result of which the NMR signal of this atomic nucleus can be amplified in the subsequent NMR measurement. In order to preserve the transferred polarization as much as possible when the sample is transported between the second location and the first location, this transport should take place quickly, for which a short path between the second location and the first location is desired.

EP 3 081 954 B1 in detail describes 2F-NMR measurements involving a sample in a first working volume of a highly homogeneous magnetic field with a first field strength and transferring the sample to a second working volume with a magnetic field having lower homogeneity at a second field strength. A sample carrier is provided for transporting the sample between the first working volume and the second working volume.

The usual structure of a magnet system of a 2-field NMR spectrometer comprises a superconducting magnet (magnetic coil) in a cryostat. The first sample volume (first magnetic center) is formed in the magnetic center of the superconducting magnet which is located in the room temperature bore of the cryostat. The second sample volume (second magnetic center) is in the room temperature bore in the stray field of the superconducting magnet, an approximately homogeneous magnetic field being generated locally by means of ferromagnetic shims. This magnet structure can be produced using a standard NMR system by installing the ferromagnetic shims in the room temperature bore. The disadvantage of this magnet structure is that the field strength in the second sample volume is limited to approximately 0.5 Tesla or less. Furthermore, the field strength in the second sample volume is not freely adjustable. When the ferromagnetic shims are arranged in the room temperature bore, the installation space is also considerably restricted.

US 2016/0076924 A1 describes a field cycling magnetic resonance based method and apparatus to measure and analyze flow properties in flowing complex. The pre-polarization magnet is a Halbach magnet through which the fluids flow. Relaxation of the magnetizations is performed in a second magnetic field region of variable intensity, and the measuring step is done in a third magnetic field region on an NMR measurement module. Due to the flow-nature of this experiment, the according apparatus does not comprise any shuttle system.

WO 2011/151049 A1 describes a method and a device for carrying out a nuclear spin relaxometry method for determining the longitudinal relaxation behavior of nuclear spins of a sample. The method comprises the steps of pre-polarization, evolution and detection. The pre-polarization of nuclear spins of a sample takes place in a large magnetic field with a magnitude of up to one Tesla. When the nuclear spin magnetization has reached a saturation state, a sufficiently fast (non-adiabatic) switching of the magnetic field to a small, adjustable evolutionary magnetic field takes place in such a way that the nuclear spins cannot follow. At the end of the evolution period, there is again a switchover of the magnetic field to a detection magnetic field, with the z-component of the magnetization being registered in the detection magnetic field. Switching between the different fields is achieved with appropriate coil arrangements and their rapid switching. A transport of the sample is not described. Thus, this known 2-field NMR experiment is also performed without a shuttle. In addition, the very different magnetic fields of extremely variable strengths are generated by only a single magnet system.

Zhoukov et al., "Field-cycling NMR experiments in an ultra-wide magnetic field range: relaxation and coherent polarization transfer", Phys. Chem. Chem. Phys., 2018, 20, 12396-12405 studied the relaxation and polarization transfer phenomena by using a shuttle system and measuring the magnetic field dependence of T1-relaxation times over the field range from 10 nT to 9.4 T in the heteronuclear spin systems. The shuttle system comprises a carriage, which is mechanically moved by a rack-and-gear system with a relatively slow transfer time of about 0.5 s. This slow transfer time leads to a loss in polarization. To go to fields below 2 mT a magnetic shield is mounted on top of the NMR spectrometer; inside the shield the field is low. To vary the field in the range below 2 mT the current in the magnetic coils located inside the shield is adjusted. Additional shim coils are used to compensate linear and quadratic magnetic field gradients.

U.S. Pat. No. 11,579,224 B2 describes a magnet system for 2-field NMR experiments, comprising a superconducting main field magnet for generating a first magnetic field in a first sample volume, a superconducting additional field magnet for generating a second magnetic field in a second sample volume, and a cryostat having a cooled main coil container, having an evacuated room temperature covering, and having a RT bore which extends through the main field magnet and through the additional field magnet. The magnet system comprises a cooled additional coil container in a vacuum. The RT covering has a flange connection with an opening through which the RT bore extends. A front end of the additional coil container protrudes through the flange opening into the RT covering such that the additional field magnet also at least partly protrudes through the flange opening into the RT covering. A closure structure which seals the RT covering between the flange connection and the RT bore is installed on the flange connection. This makes 2-field NMR spectroscopy which can be used flexibly and has good signal strength.

EP 4 071 492 B1 (discussed above) describes a generic two-field NMR spectrometer comprising a high field superconducting NMR magnet system bridged by a magnetic tunnel with a low field magnet system generating a variable homogenous magnetic field and a shuttle system designed for shuttling the NMR sample between the high field superconducting NMR magnet system and the low field permanent magnet system. In particular, this reference describes in detail a transfer device being part of the shuttle assembly.

SUMMARY OF THE INVENTION

The present invention presents an improved generic two-field NMR spectrometer allowing fast field-cycling NMR experiments over a wide range of magnetic fields, preferably from very low 100 μT to very high 29.3 T. In particular, the invention provides very homogeneous low fields, excellent resolution of detected spectra at high fields, and high detection sensitivity, preserving as much as possible the lifetime of manipulated spins.

One advantage of the invention is to overcome the loss of polarization due to a spin-spin relaxation during shuttling. Also, the influence of the two magnet systems to each other, i.e. the polarization high field magnet and the low field magnet, is minimized.

Another aspect of the present invention is in allowing relaxometry measurements with a higher sensitivity than in the prior art by providing an evolution field magnet which has a high homogeneity at a very low field. It is apparent to the expert that the arrangement of the low-field magnet and its shielding against both the earth's magnetic field and the high-field magnet represent a major technical challenge.

The invention achieves these advantages by a two-field-NMR spectrometer wherein the magnetic tunnel is provided with a further magnet system and wherein the high field superconducting NMR magnet system, the magnetic tunnel and the low field magnet system are arranged coaxially about the z-axis along a bore of the high field superconducting NMR magnet system.

In the discussion of the present invention the terms low field magnet system, field cycling coil and relaxation magnet are used synonymously.

The transfer system according to the invention can easily be integrated into a commercial NMR spectrometer in a space-saving manner and is capable of moving an NMR sample container, which is fastened to the shuttle assembly, precisely between at least two adjustable measuring positions in less than 100 ms.

The system can be adapted to existing or commercially available NMR spectrometers without any modification in the magnet bore.

In a particular class of embodiments of the invention, the further magnet system of the magnetic tunnel comprises permanent magnets, preferably arranged in a Halbach dipole configuration with k=2. The Halbach arrangement allows for intense magnetic field inside the tunnel and a very low stray field outside of the tunnel.

In further developments of this class of embodiments, the magnetic field generated by the further magnet system of the magnetic tunnel is directed perpendicular to the homogenous magnetic field parallel to a z-axis generated by the high field superconducting NMR magnet system. Creating a field perpendicular to the tunnel axis is the most efficient direction for the Halbach arrangement. It allows minimizing the required amount of permanent magnets for a given field intensity.

In another advantageous embodiment, the further magnet system of the magnetic tunnel is designed for generating an adiabatic magnetic field with a flux density in a range from 0.5 T to 1 T. The principle of the magnetic tunnel allows to preserve the life of polarized spins during rapid sample movement between the two magnetic fields, i.e. the high field superconducting magnet and the low field magnet system (i.e., field cycling coil).

The solution according to the present invention allows using a field coil in the relaxation or field cycling magnet which is not actively shielded, i.e. an additional shield coil is not necessary. Consequently the relaxation magnet is more efficient in a way that a higher magnetic field can be achieved with the same current.

By using a magnetic tunnel, the field cycling coil can be positioned outside the superconducting magnet. Not being limited by the superconducting magnet bore allows for a bigger coil in the relaxation magnet and no need of an active shielding.

In a further development of this embodiment, one end of the further magnet system of the magnetic tunnel is arranged in a region of the bore where the flux density of the homogenous magnetic field generated by the high field superconducting NMR magnet system has dropped to about 1 T, such that the sample is never in a non-magnetic environment. The direction of the magnetic field is not important. Before entering the field cycling coil, the sample is always exposed to a magnetic field of at least 1 T. This ensures that the polarization is not lost during the transfer process.

An exemplary embodiment of the invention is characterized in that the high field superconducting NMR magnet system is designed for generating a homogenous magnetic field in a range from 5 T to 30 T, in particular from 7.3 T to 29.3 T. In present embodiments, 600.13 Mhz=14.65 Tesla/700.13 Mhz=17.09 Tesla superconducting magnets are used, but in theory the present technology can go up to the Bruker ultra-high field magnets with 1.2 GHz corresponding to 29.29 Tesla.

The higher the field, the higher the resolution. By adjusting the ring-shaped permanent magnets (shimming rings) to the magnet, one can adapt the system to any superconducting magnet. In theory, one can even improve the system by using a higher field superconducting magnet. It is possible to adapt an existing system to a new magnet, for example if a customer wants to use a stronger magnet.

In an advantageous embodiment, the low field magnet system comprises a resistive coil-based electromagnet arrangement for field-cycling designed for generating a homogenous magnetic field with variable magnetic flux density in a range from 100 μT to 1 T. This means that the low field magnet system can produce much lower magnetic fields compared to unshielded magnets in the prior art, which have a lower limit of 200 μT. The low-field range of the device is therefore significantly expanded by this innovation.

In variants of this embodiment, the magnetic field generated by the electromagnet arrangement for field-cycling has a homogeneity of at least 10% along the NMR sample, preferably within a switching time of about 1 ms or less. The exposure of the sample in a homogeneous and temporary stable magnetic field is important for the signal quality.

Advantageous is a further embodiment, wherein the low field magnet system for field-cycling is arranged directly above the high field superconducting NMR magnet system. The field cycling coil is sufficiently distanced from the superconducting high field magnet such that magnetic coupling with the SC magnet can be avoided. The electrical power required for the same magnetic field is greatly reduced. Moreover, the water cooling of the relaxation magnet is more efficient because there more space for the cooling system. The extra radial space allows for having 12 coils and 6 water jackets and so to reach a maximum field of 0.8 T as well as a high duty cycle.

In another embodiment, the low field magnet system comprises ring-shaped permanent magnets with a radial magnetization relative to the z-axis, in particular designed for cancelling the magnetic stray field arising from the high field superconducting NMR magnet system. Using permanent magnets is a passive solution so that no extra power or cooling is needed. It is easy to add axial adjustment of the rings. This allows for dealing with the variations in the stray field of the superconducting magnet by simply changing the axial position of the magnet rings.

Also provided is a class of embodiments, which are characterized in that the low field permanent magnet system comprises a cylindrical ferromagnetic part, in particular comprising u-metal, for shielding non-homogeneous external magnetic disturbance fields at low flux densities. A ferromagnetic u-metal part is used in the Field Cycling Coils to maintain the same field homogeneity over the 100 μT-0.8 T range. The shape of the part and its thickness are optimized so that:

at high fields: the ferromagnetic part is magnetically saturated, but the external non-homogeneous disturbance fields (earth's magnetic field, leakage field from the superconducting magnet and magnetic tunnel, etc.) are weak compared with the field from the zero-coil, so the expected field homogeneity is achieved; and at low fields: the non-homogeneous external disturbance fields (earth's magnetic field, leakage field from the superconducting magnet and magnetic tunnel, etc.) are greater than that of the zero-coil. But since the field is weak, the ferromagnetic part channels the non-homogeneous external disturbance fields as well as the field of the coils, and homogeneity is maintained at very low field strength, having optimized the first two coils (inside the u-metal part) for low field strength.

Using μ-metal parts is a passive solution to damp and shield any remaining low external magnetic field. In principle, the μ-metal part works independently of the orientation of the low remaining magnetic field. So one does not need extra shimming coils and power amplifiers.

In this class of embodiments, the low field magnet system comprises at least one low field coil arranged inside the cylindrical ferromagnetic part designed for producing magnetic fields at flux densities below the magnetic saturation of the ferromagnetic part. This coil is needed to generate fields in the range between 100 μT and a few mT. Otherwise the field created by the coils would be shielded and the field at the coil center would be 0 T.

Another variant of this class of embodiments is characterized in that the low field magnet system comprises at least one high field coil arranged outside the cylindrical ferromagnetic part for generating magnetic fields at flux densities above the magnetic saturation of the ferromagnetic part. These coils must be arranged radially outside the μ-metal shield so that their field is shielded by the μ-metal when the field is below the saturation of the μ-metal.

In embodiments of the invention, the shuttle system is designed for shuttling the NMR sample between the high field superconducting NMR magnet system and the low field magnet system in less than 100 ms. The polarization of the sample is ideally preserved by very fast shuttling through the adiabatic magnetic field of the magnetic tunnel.

Further advantages can be extracted from the description and the enclosed drawings. The features mentioned above and below can be used in accordance with the invention either individually or collectively in any combination. The embodiments mentioned are not to be understood as exhaustive enumeration but rather have exemplary character for the description of the invention.

BRIEF DESCRIPTION OF THE DRAWINGS

The invention is shown in the drawings and is explained in more detail on the basis of illustrative embodiments.

DETAILED DESCRIPTION

Figure 1:
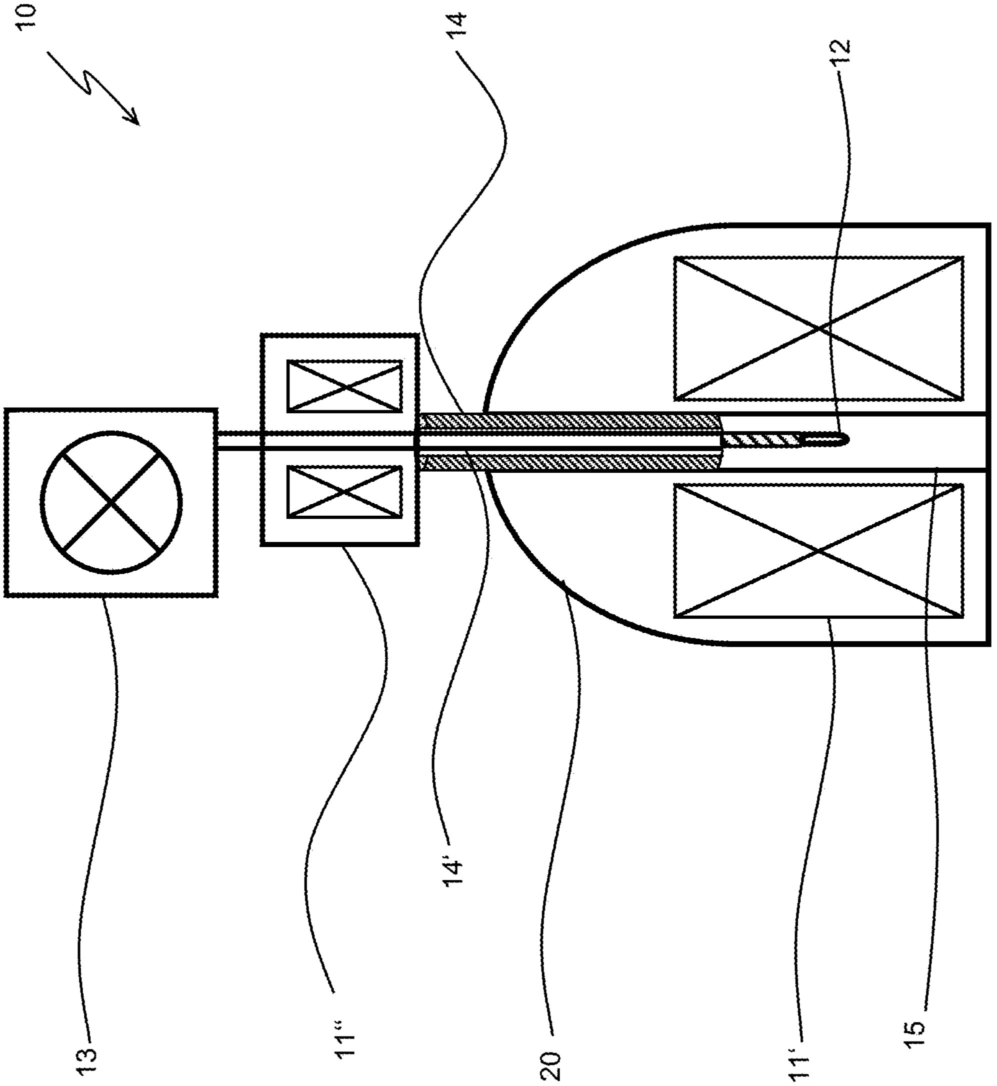
FIG. 1 shows a schematic vertical cross section through an NMR spectrometer with a modified magnetic tunnel according to the invention.

FIG. 1 schematically depicts a Two-Field-NMR spectrometer 10 for performing field-cycling NMR relaxometry experiments comprising

- a high field superconducting NMR magnet system 11' for generating a homogenous magnetic field parallel to a z-axis in a central region of the two-field-NMR spectrometer 10 for polarization of an NMR sample 12 and for detection of NMR signals;
- a low field magnet system 11" generating a variable homogenous magnetic field;
- a shuttle system 13 designed for shuttling the NMR sample 12 between the high field superconducting NMR magnet system 11' and the low field permanent magnet system 11"; and
- a magnetic tunnel 14 connecting the center of the high field superconducting NMR magnet system 11' with the low field magnet system 11".

The Two-Field-NMR spectrometer 10 according to the invention is characterized by the magnetic tunnel 14 being provided with a further magnet system 14' and by the high field superconducting NMR magnet system 11', the magnetic tunnel 14 and the low field magnet system 11" being arranged coaxially about the z-axis along a bore 15 of the high field superconducting NMR magnet system 11' contained in a cryostat 20.

The low field magnet system 11" for field-cycling is arranged directly above the high field superconducting NMR magnet system 11' for avoiding long sample transfer ways. Hence, the field cycling magnet has to eliminate the residual fields of the high field magnet and the tunnel magnets.

The shuttle system 13 is designed for shuttling the NMR sample 12 between the high field superconducting NMR magnet system 11' and the low field magnet system 11" in less than 100 ms. Thus, the present invention uses a comparatively fast sample shuttling technique and it improves the loss of signal (polarization) during the shuttling. The low field magnet is arranged in close vicinity of the high field magnet, but outside the cryostat 20 of the high field magnet, which allows a short shuttling distance.

The basic idea of the invention was to design an improved Two-Field-NMR spectrometer 10 for performing field-cycling NMR having an excellent resolution at the high field part with magnetic fields of flux density up to 30 T and being adapted to reach very low magnetic fields of flux density down to 100 μT at the low field part of the apparatus.

The system according to the invention can easily be adapted to existing NMR spectrometers without any modification in the magnet bore.

Figure 2:
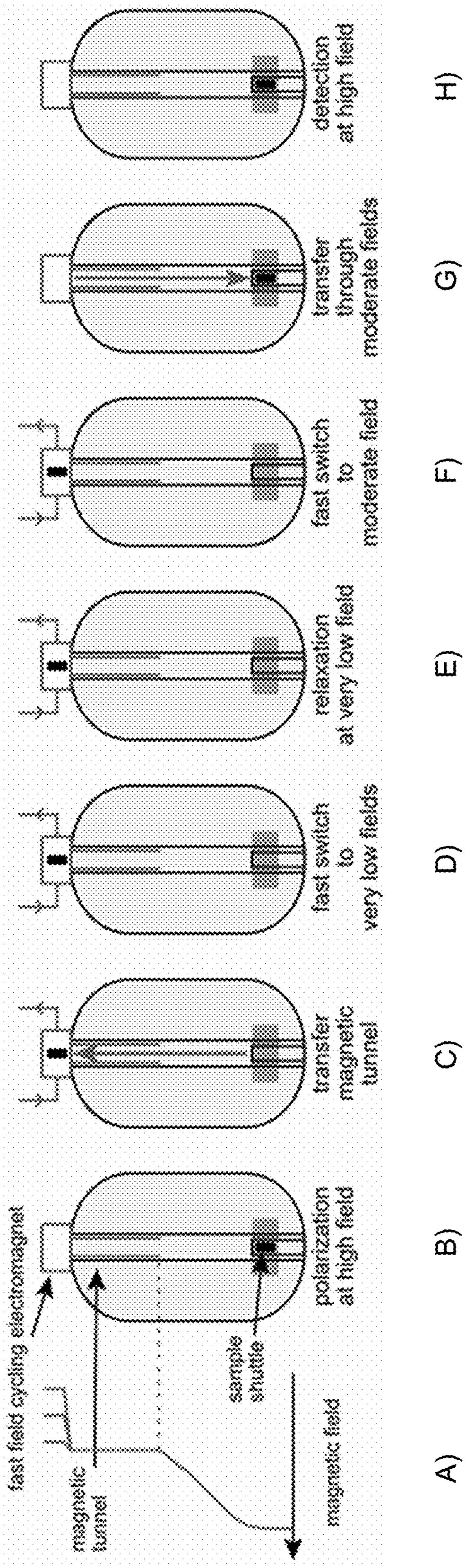
FIG. 2 shows a schematic diagram of a preferred method of field cycling by using the two-field-NMR spectrometer according to the invention with the field cycling coil located at the upper end of the magnetic tunnel.

The schematic diagram of FIG. 2 is depicting a preferred method of field cycling by using the two-field-NMR spectrometer according to the invention with the field cycling coil arranged above the superconducting high field magnet. The sample is shuttled between the high-field superconducting NMR magnet system 11' and the low-field NMR magnet system 11" through the magnetic tunnel 14.

Said method corresponds to the method according to the Zhoukov et al. reference discussed above, with the difference that the spectrometer uses a fast shuttle for a very fast transportation of the sample tube as disclosed in EP 4 071 492 B1 from the polarization magnet to the relaxation magnet. In addition, Zhoukov et al. does not use a magnetic tunnel and thus they lose polarization and hence signal during the transfer.

This solution is to extend the average field zone from 0.5 T to 1 T towards the outside of the cryomagnet, by adding a magnetic tunnel (usually between 0.7 T and 1 T). This solution makes it possible to use a field cycling coil (relaxation magnet) without an additional shielding coil, i.e. one that is more efficient (more field with the same current). The electrical power required for the same field is greatly reduced, and water cooling is also more efficient (more space for the cooling system).

The schematic diagram of FIG. 2 presents a preferred mode of operation with the relaxation field coil moved outside the magnet and the magnetic tunnel added:

A) Shows the magnetic field evolution in z-direction along the bore. This represents the magnetic field strength to which the sample is exposed. The dotted line shows the lower end of the magnetic tunnel such that the field strength is maintained during the transfer of the sample from this distinct level (approx. 1 T).

B) In the first step of the method, the sample is polarized in the high field magnet during a predefined exposure time.

C) The second step is the quick transfer of the sample to the FCC through the adiabatic magnetic tunnel.

D) The FCC can be switched quickly (1 ms) to the pre-selected magnetic field (here: 100 μT-0.8 T) for relaxation.

E) The sample is exposed to the relaxation field during a defined time period.

F) Optionally the FCC the sample can be changed to a moderate field.

G) The sample is then transferred back to the high field magnet.

H) The spectrum acquisition is performed in the high field magnet.

Figure 3:
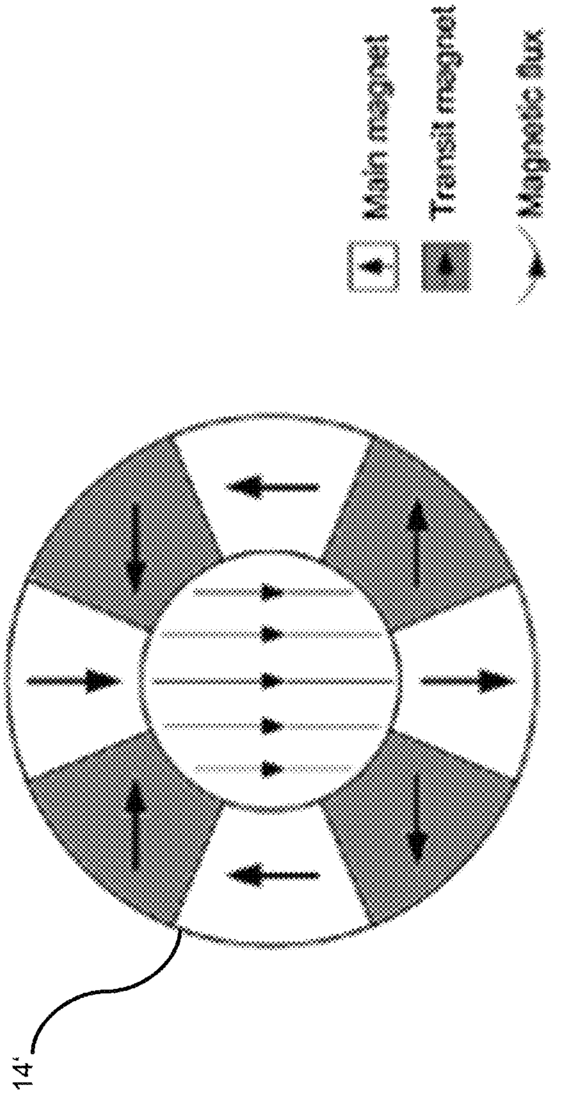
FIG. 3 shows a sectional drawing through the magnetic tunnel with arrows indicating the direction of magnetic flux inside the hollow magnetic tunnel and inside the magnetic material establishing the tunnel.

In a sectional drawing through the magnetic tunnel 14, FIG. 3 shows an embodiment of the further magnet system 14' of the magnetic tunnel 14 comprising permanent magnets arranged in a Halbach dipole configuration with k=2. Arrows are indicating the direction of magnetic flux inside the hollow magnetic tunnel and inside the magnetic material establishing the tunnel.

The magnetic field generated by the further magnet system 14' of the magnetic tunnel 14 being designed for generating an adiabatic magnetic field with a flux density in a range from 0.7 T to 1 T is directed perpendicular to the homogenous magnetic field parallel to a z-axis generated by the high field superconducting NMR magnet system 11'.

One end of the further magnet system 14' of the magnetic tunnel 14 is arranged in a region of the bore 15 where the flux density of the homogenous magnetic field generated by the high field superconducting NMR magnet system 11' has dropped to about 1 T.

Inside the ring of the further magnet system 14', a strong horizontal field is generated. By piling up many such rings, a long tunnel with constant horizontal field can be achieved.

The following assumptions were made:

The permanent magnetic material used is NdFeB with a magnetic remanence of 1.39 T.

The inner radius of the ring is 8.5 mm, the outer radius is 20 mm. The resulting magnetic field inside the ring attains more than 1 T.

The magnetic tunnel 14 in this example has a length of 600 mm and starts axially at 400 mm from the magnetic center of a 600 MHz magnet and starts at 500 mm from the magnetic center of a 700 MHz magnet. It generates a field inhomogeneity which can be easily compensated with a room temperature shim system at the magnetic center of the cryomagnet.

The 2F NMR device according to the present invention comprises three distinct main magnetic elements:

a. The high field magnet for polarization b. The magnetic tunnel c. The Field Cycling Coil ("FCC") for relaxation where a) The high field polarization magnet is generally the superconducting NMR Magnet which can be chosen e.g. from 7.3 T to 29.3 T b) The magnetic tunnel is constituted of permanent magnets in the Halbach configuration. Producing an adiabatic magnetic field at a field strength of 0.5 T to 1.5 T depending on the nucleus. The magnetic tunnel is important for preserving the spin polarization during the transfer between the magnets a) and c).

The magnetic tunnel is arranged in the bore of the superconducting magnet, where the field strength has dropped to about 1 T such that the sample is never in a non-magnetic environment, preferably never below a magnetic field of 0.7 T. The direction of the magnetic field is not important; the superconducting magnet and the FCC both produce a field in z-direction along the common bore while the magnetic tunnel produces a perpendicular field in x-direction due to the Halbach configuration.

c) The Field Cycling Coil or fast field cycling magnet (FCC) is an electromagnet, which can be varied from 100 μT to 1 T in a very short time of 1 ms. This magnet is not actively shielded, but its design permits to be independent from the magnetic field of the high field magnet in Z-direction, the field of the magnetic tunnel in x-direction and the earth magnetic field. The FFC magnet must have a homogeneity of at least 10% along the sample.

Figure 4:
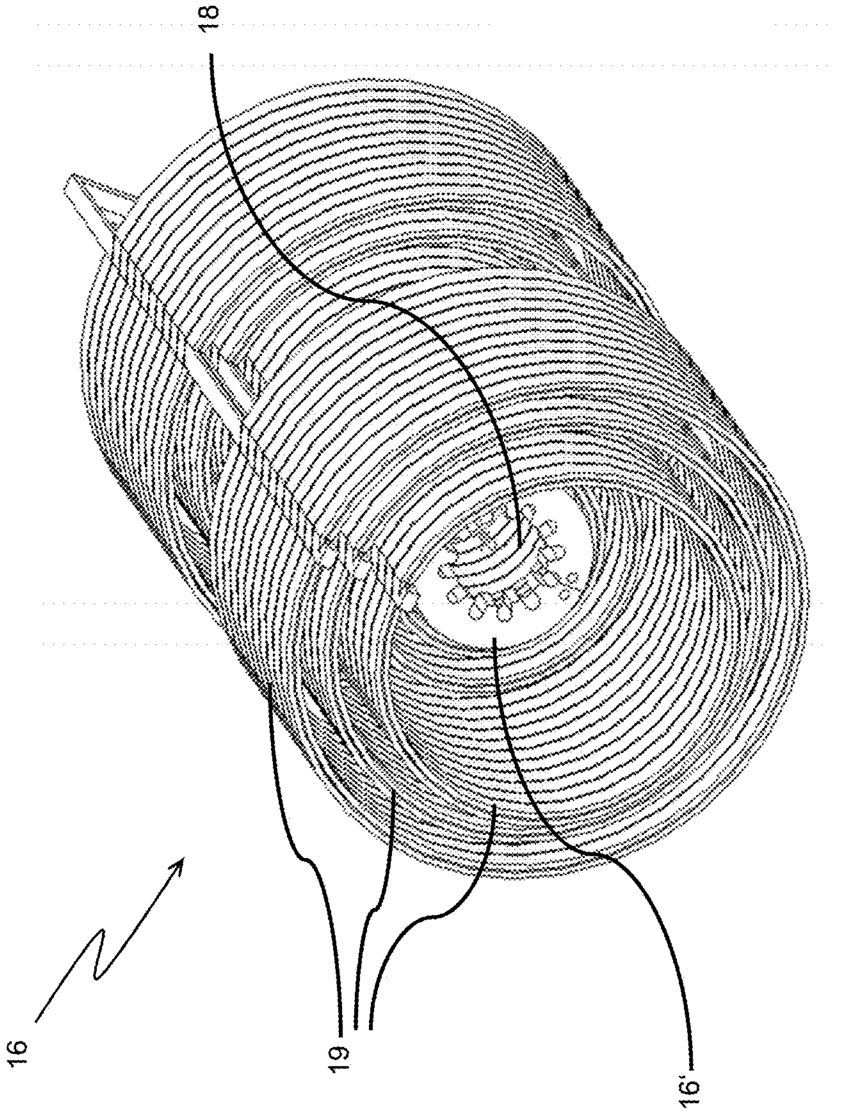
FIG. 4 shows in a schematic stereoscopic view a resistive coil-based electromagnet arrangement for field-cycling designed for generating a homogenous magnetic field with variable magnetic flux density and comprising a low field coil system arranged inside a cylindrical ferromagnetic part being surrounded by a high field coil system for generating magnetic fields at flux densities above the magnetic saturation of the ferromagnetic part.

FIG. 4 illustrates in a schematic stereoscopic view an important detail of a preferred embodiment of the Two-Field-NMR spectrometer 10 according to the invention:

Here, the low field magnet system 11" comprises a resistive coil-based electromagnet arrangement 16 for field-cycling designed for generating a homogenous magnetic field with variable magnetic flux density in a range from 100 μT to 1 T and a homogeneity of at least 10% along the NMR sample 12, preferably within a switching time of about 1 ms or less.

The low field permanent magnet system 11" comprises a cylindrical ferromagnetic part 16', in particular comprising μ-metal, for shielding non-homogeneous external magnetic disturbance fields at low flux densities.

Further, the low field permanent magnet system 11" comprises at least one low field coil 18 arranged inside the cylindrical ferromagnetic part 16' designed for producing magnetic fields at flux densities below the magnetic saturation of the ferromagnetic part 16'.

In addition, the low field permanent magnet system 11" comprises at least one high field coil 19 arranged outside the cylindrical ferromagnetic part 16' for generating magnetic fields at flux densities above the magnetic saturation of the ferromagnetic part 16'.

Figure 5:
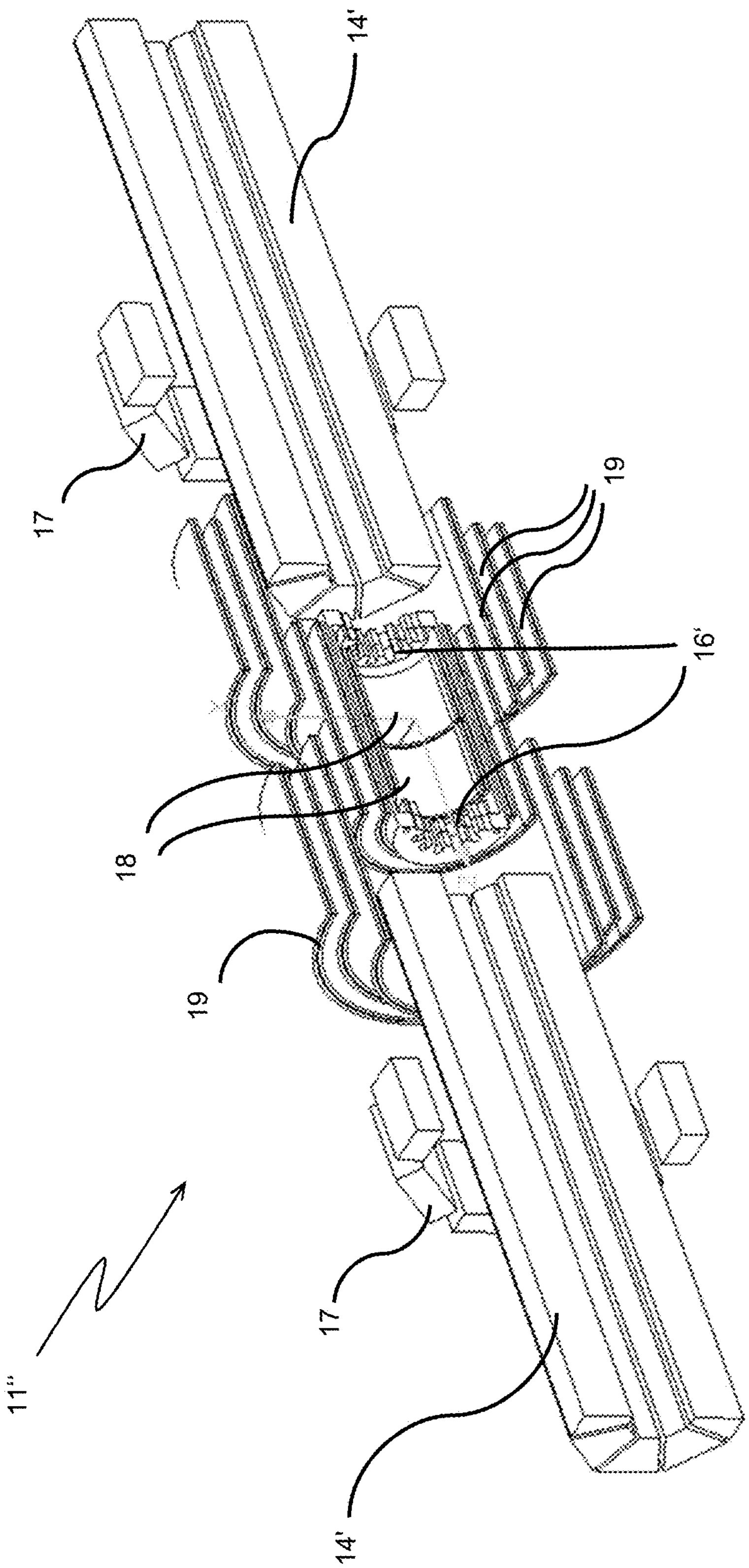
FIG. 5 shows in a schematic stereoscopic partial view an embodiment of the low field permanent magnet system in an NMR spectrometer according to the invention comprising the resistive coil-based electromagnet arrangement for field-cycling as depicted in FIG. 4, the further magnet system of the magnetic tunnel and ring-shaped permanent magnets radially surrounding the further magnet system.

FIG. 5 illustrates in a schematic stereoscopic partial view an embodiment of the low field permanent magnet system in a Two-Field-NMR spectrometer 10 according to the invention comprising the resistive coil-based electromagnet arrangement 16 for field-cycling as depicted in FIG. 4, the further magnet system 14' of the magnetic tunnel 14 and ring-shaped permanent magnets 17 radially surrounding the further magnet system 14' with a radial magnetization relative to the z-axis.

This additional system of ring-shaped permanent magnets 17 is designed for cancelling the magnetic stray field arising from the high field superconducting NMR magnet system 11' in order to achieve the very low field of about 100 μT. The amplitude of superconducting magnet stray field of the high field superconducting NMR magnet system 11' is about 10 mT at the center of the coils of the low field permanent magnet system 11". The rings are radially magnetized in opposite direction to create a constant magnetic field with a gradient along the z axis.

Exemplary Embodiment of the Magnetic Tunnel:

In High Resolution Two Field NMR, an NMR sample is shuttled between a high field (e.g. 14 T) and a low field (e.g. 3 T). Since the sample is not allowed to lose its polarization, the path between high field and low field must be in a background field as high as possible. The field direction is unimportant.

The concept for Two Field NMR according to the invention is to add a low field magnet on top of the high field magnet. In the path between the two magnetic centers, a magnetic tunnel made of Halbach arrays can maintain a minimum flux density.

LIST OF REFERENCE SIGNS

10 Two-Field-NMR spectrometer
11' high-field superconducting NMR magnet system
11" low-field NMR magnet system
12 NMR sample
13 shuttle system
14 magnetic tunnel
14' further magnet system
15 bore of the high field superconducting NMR magnet system
16 resistive coil-based electromagnet arrangement for field-cycling
16' cylindrical ferromagnetic part, in particular comprising μ-metal
17 ring-shaped permanent magnets
18 low field coil arranged inside the cylindrical ferromagnetic part
19 high field coil arranged outside the cylindrical ferromagnetic part
20 NMR cryostat

The invention claimed is:

1. A two-field-NMR spectrometer for performing field-cycling NMR relaxometry experiments comprising:

- a high field superconducting NMR magnet system for generating a homogenous magnetic field parallel to a z-axis in a central region of the two-field-NMR spectrometer for polarization of an NMR sample and for detection of NMR signals;
- a low field magnet system generating a variable homogenous magnetic field, wherein the low field magnet system comprises ring-shaped permanent magnets with a radial magnetization relative to the z-axis that cancel a magnetic stray field arising from the high field superconducting NMR magnet system;
- a magnetic tunnel connecting the center of the high field superconducting NMR magnet system with the low field magnet system, wherein the magnetic tunnel comprises a further magnet system, the high field superconducting NMR magnet system, the magnetic tunnel and the low field magnet system being arranged coaxially about the z-axis along a bore of the high field superconducting NMR magnet system; and
- a shuttle system configured to shuttle the NMR sample between the high field superconducting NMR magnet system and the low field magnet system.

2. The NMR spectrometer according to claim 1, wherein the further magnet system of the magnetic tunnel comprises permanent magnets.

3. The NMR spectrometer according to claim 2, wherein the permanent magnets of the magnetic tunnel are arranged in a Halbach dipole configuration with k=2.

4. The NMR spectrometer according to claim 2, wherein a magnetic field generated by the further magnet system of the magnetic tunnel is directed perpendicular to the homogenous magnetic field generated by the high field superconducting NMR magnet system.

5. The NMR spectrometer according to claim 1, wherein the further magnet system of the magnetic tunnel is configured to generate an adiabatic magnetic field with a flux density in a range from 0.7 T to 1 T.

6. The NMR spectrometer according to claim 1, wherein one end of the further magnet system of the magnetic tunnel is arranged in a region of the bore where the flux density of the homogenous magnetic field generated by the high field superconducting NMR magnet system has dropped to about 1 T.

7. The NMR spectrometer according to claim 1, wherein the high field superconducting NMR magnet system is configured to generate a homogenous magnetic field in a range from 5 T to 50 T.

8. The NMR spectrometer according to claim 1, wherein the low field magnet system comprises a resistive coil-based electromagnet arrangement for field-cycling designed for generating a homogenous magnetic field with variable magnetic flux density in a range from 100 μT to 1 T.

9. The NMR spectrometer according to claim 8, wherein the magnetic field generated by the electromagnet arrangement for field-cycling has a homogeneity of at least 10% along the NMR sample.

10. The NMR spectrometer according to claim 8, wherein the low field magnet system is arranged directly above the high field superconducting NMR magnet system.

11. The NMR spectrometer according to claim 1, wherein the low field permanent magnet system comprises a cylindrical ferromagnetic part comprising u-metal, for shielding non-homogeneous external magnetic disturbance fields at low flux densities.

12. The NMR spectrometer according to claim 11, wherein the low field permanent magnet system comprises at least one low field coil arranged inside the cylindrical ferromagnetic part that is configured to produce magnetic fields at flux densities below a magnetic saturation of the ferromagnetic part.

13. The NMR spectrometer according to claim 11, wherein the low field permanent magnet system comprises at least one high field coil arranged outside the cylindrical ferromagnetic part for generating magnetic fields at flux densities above a magnetic saturation of the ferromagnetic part.

14. The NMR spectrometer according to claim 1, wherein the shuttle system is configured to shuttle the NMR sample between the high field superconducting NMR magnet system and the low field magnet system in less than 100 ms.

15. The NMR spectrometer according to claim 1, wherein the high field superconducting NMR magnet system is configured to generate a homogenous magnetic field in a range from 7.3 T to 29.3 T.

* * * * *